United States Patent
Adler et al.

(10) Patent No.: US 7,124,336 B2
(45) Date of Patent: Oct. 17, 2006

(54) METHOD FOR THE DEFECT ANALYSIS OF MEMORY MODULES

(75) Inventors: Frank Adler, München (DE); Martin Versen, München (DE)

(73) Assignee: Infineon Technologies AG, Munich (DE)

( * ) Notice: Subject to any disclaimer, the term of this patent is extended or adjusted under 35 U.S.C. 154(b) by 428 days.

(21) Appl. No.: 10/200,642

(22) Filed: Jul. 22, 2002

(65) Prior Publication Data

US 2003/0028342 A1    Feb. 6, 2003

(30) Foreign Application Priority Data

Jul. 20, 2001   (DE)   ................. 101 34 654

(51) Int. Cl.
G11C 29/00   (2006.01)

(52) U.S. Cl. .................. 714/723; 714/718

(58) Field of Classification Search ........ 714/718–723; 365/200–201
See application file for complete search history.

(56) References Cited

U.S. PATENT DOCUMENTS 5,062,109 A * 10/1991 Ohshima et al. ............ 714/719
5,410,687 A * 4/1995 Fujisaki et al. ............. 365/201
5,539,699 A * 7/1996 Sato et al. .................. 365/201
5,909,448 A * 6/1999 Takahashi .................... 714/719
6,449,704 B1* 9/2002 Takano ....................... 711/173
6,477,672 B1* 11/2002 Satoh ........................... 714/721

FOREIGN PATENT DOCUMENTS

DE    196 80 964 T1    3/1997

\* cited by examiner

*Primary Examiner*—Guy Lamarre
*Assistant Examiner*—John J. Tabone, Jr.
(74) *Attorney, Agent, or Firm*—Laurence A. Greenberg; Werner H. Stemer; Ralph E. Locher (57) ABSTRACT

A computer system has at least one data defect memory, at least one address defect memory and also a test program. The computer system is connected to a memory module that has a memory space with defect-free and defective memory cells, a plurality of data lines, and a plurality of address lines. The addresses of the defective memory cells in the memory space and the data lines that are connected to the defective memory cells are determined from the information items of the address defect memory and also from the information items of the data defect memory.

11 Claims, 4 Drawing Sheets

| 0  | 1  | 2  | 3  | 4  | 5  | 6  | 7  | 8  | 9  | 10 | 11 | 12 | 13 | 14 | 15 |
| 61 | 16 | 17 | 18 | 19 | 20 | 21 | 22 | 23 | 24 | 25 | 26 | 27 | 28 | 29 | 30 |
| 62 | 31 | 32 | 33 | 34 | 35 | 36 | 37 | 38 | 39 | 40 | 41 | 42 | 43 | 44 | 45 |
| 63 | 46 | 47 | 48 | 49 | 50 | 51 | 52 | 53 | 54 | 55 | 56 | 57 | 58 | 59 | 60 |

21 ↓

| 0  | 1  | 2  | 3  | 4  | 5  | 6  | 7  | 8  | 9  | 10 | 11 | 12 | 13 | 14 | 15 |
| 16 | 61 | 17 | 18 | 19 | 20 | 21 | 22 | 23 | 24 | 25 | 26 | 27 | 28 | 29 | 30 |
| 31 | 62 | 32 | 33 | 34 | 35 | 36 | 37 | 38 | 39 | 40 | 41 | 42 | 43 | 44 | 45 |
| 46 | 63 | 47 | 48 | 49 | 50 | 51 | 52 | 53 | 54 | 55 | 56 | 57 | 58 | 59 | 60 |

22 ↓

| 0  | 1  | 2  | 3  | 4  | 5  | 6  | 7  | 8  | 9  | 10 | 11 | 12 | 13 | 14 | 61 |
| 15 | 16 | 17 | 18 | 19 | 20 | 21 | 22 | 23 | 24 | 25 | 26 | 27 | 28 | 29 | 62 |
| 30 | 31 | 32 | 33 | 34 | 35 | 36 | 37 | 38 | 39 | 40 | 41 | 42 | 43 | 44 | 63 |
| 45 | 46 | 47 | 48 | 49 | 50 | 51 | 52 | 53 | 54 | 55 | 56 | 57 | 58 | 59 | 60 |

METHOD FOR THE DEFECT ANALYSIS OF MEMORY MODULES

BACKGROUND OF THE INVENTION

Field of the Invention

The invention relates to a method for the defect analysis of memory devices or of memory modules for carrying out on a computer system.

In the prior art, methods are known in which defective memory devices and defective memory modules are analyzed by multiple repetitions of measurements. In this case, the failing data lines are determined in a first step, the addresses of the failing memory cells are determined in a second step, and the critical parameters of the failure are determined in a third step. In this case, an address defect memory or an analysis fail memory is provided which has a limited storage capacity of 16 Mb per data line.

In the case of the known methods, it is disadvantageous that memory devices or memory modules which have a memory depth or a memory space of ≧16 Mb per data line cannot be analyzed reliably. Furthermore, it is disadvantageous that a multiplicity of steps are required for the defect analysis of memory modules.

SUMMARY OF THE INVENTION

It is an object of the invention to provide a method for the defect analysis of memory modules by which memory modules and memory devices which have a high memory depth or a large memory space per data line can be analyzed reliably and speed-optimally.

According to the invention, for carrying out the method for the defect analysis of memory modules, provision is made of a computer system which can be connected to a memory module to be tested. The computer system has at least one data defect memory, at least one address defect memory and also a test program.

The memory module is structured into a memory space, comprising a multiplicity of memory cells for storing information items, into a plurality of consecutively numbered data lines, used for reading in and for reading out information items, and also into a plurality of address lines, provided for addressing the memory cells.

Each memory cell is uniquely determined by an address in the memory module and also by a part of the memory space in which the memory cell is arranged. The addressing of the addresses of the individual memory cells is effected by means of the address lines. The address lines are connected to all the memory devices in parallel. The address lines are multiplexed and used to span the entire address space.

A memory module according to the invention has a multiplicity of memory devices. Each memory device has a multiplicity of memory cells which can be uniquely addressed by data lines. Individual parts of the memory space are defined by the relevant data lines.

The data defect memory is provided as a list in which all numbers of those data lines which are connected to defective memory cells are stored. The address defect memory is provided for receiving property information items about the functionality of memory cells. A respective address defect memory cell contains an information item about defect-free and about defective memory cells. The address defect memory is formed from the memory space or from an area of the memory space, the division of the address defect memory corresponding to the division of the memory space with regard to the addresses of the memory cells in the memory module.

During an analysis of the memory module, by means of a test program, test information items are written to all the memory cells and are subsequently read again. In this case, it is expected that the read memory information items will correspond to the test information items previously written. This comparison takes place simultaneously on all the data lines. If the memory information items do not correspond to the test information items in the case of a memory cell, then the memory cell is a defective memory cell. The test program registers a defect in this case. The defect outputting is in this case effected on the data line which is connected to the defective memory cell. The number of this data line is stored in the data defect memory.

This evaluation does not yield a statement of how many memory cells on the memory space part determined by the data line are defective and which addresses in the memory space are assigned to these memory cells.

If the data defect memory has no numbers of data lines, the tested memory module comprises no defective memory cells. The method for the defect analysis of memory modules is ended here in this case.

Afterward, by means of the test program, once again test information items are written to all the memory cells and are read out again. This is followed by a comparison of the test information with the memory information for each memory cell for correspondence. Each tested memory cell is assigned an address defect memory cell. In each case different information items for defect-free and for defective memory cells are stored in the address defect memory cells. Preferably, a number "1" is stored in the corresponding address defect memory cell in the case of a deviation of the test information from the memory information of a memory cell, while a number "0" is stored in the corresponding address defect memory cell in the case of correspondence between the test information and the memory information.

In the next step of the method according to the invention, the addresses of the defective memory cells in the memory space are determined from the information items of the address defect memory. The data lines which are connected to the part of the memory space in which the respective defective memory cells are arranged can be determined from the data defect memory.

This is followed by the outputting of the addresses of the defective memory cells in the memory module and also the parts—determined by the data lines—of the memory space in which the defective memory cells are arranged.

In accordance with a basic concept of the invention, the method for the defect analysis of memory devices has an advantageous two-stage procedure in which, in a first step, the data lines which are connected to defective memory cells are determined and, in a second step, the addresses of the defective memory cells are determined by a mapping of the memory space on the address defect memory being generated.

If, during the step of determining the data lines, no data lines which are connected to defective memory cells are identified, then the method is ended at this point. Defect-free memory modules can accordingly be identified particularly quickly by the method according to the invention.

The address defect memory used during the second step of the method is advantageously programmed very close to hardware. In this case, the structure of the memory module to be tested is transferred exactly on the address defect memory, which results in a particular transparency and comprehensibility of the method.

Through the modular design of the method for the defect analysis of memory modules, an automatic assignment of the individual steps of the method is possible in a very simple manner. This can be realized particularly advantageously by means of a control file.

The two-stage procedure of the method and also the use of the data defect memory and of the address defect memory ensure a speed-optimal and highly memory-efficient checking of memory modules.

The method according to the invention prevents a loss of information which is inevitable in the case of different generation of the address defect memory.

The formation of the memory space and also the formation of the address defect memory may be provided in a two-dimensional fashion, the data lines being contained in a first dimension and the addresses of the memory cells being contained in a further dimension. This ensures a particularly fast and very simple execution of the method according to the invention.

In accordance with one embodiment of the invention, a plurality of the memory space are combined. The memory space parts to be combined are defined by a number of memory cells which are connected to the same data line in each case. Afterward, a mapping of these parts of the memory space on an area of the address defect memory is generated. In this case, the memory cells whose mappings are combined in an address defect memory cell have in each case the same address in the memory space and also in the address defect memory. Memory cells combined in an address defect memory cell are arranged in each case different parts of the memory space.

A property information item which describes the functionality of the relevant memory cells can be received in a respective address defect memory cell. If a plurality of defect-free memory cells are combined, then the property information item of a defect-free memory cell, preferably a number "0", is entered in the corresponding address defect memory cell. If one of a plurality of memory cells to be combined is defective, then the property information item of a defective memory cell, preferably a number "1", is entered into the corresponding address defect memory cell.

In accordance with a further basic concept of the invention, parts of the memory space of the memory module are compressed in order to be able to map the information items of the complete memory space onto the address defect memory. In customary memory device defect analysis systems, the address defect memory is often made smaller than the memory space of the test memory module to be tested. The memory depth corresponds to the number of memory cells per data line. In test memory modules to be tested, the memory depth is often made so large that the addresses of the memory cells cannot be completely stored in the address defect memory. In this case, the memory depth of the test memory module to be tested exceeds that of the address defect memory.

By virtue of the invention's compression or combination of parts of the memory space and by virtue of the mapping of these combined parts of the memory space in the address defect memory, it is possible, in a highly advantageous manner, to map the information items of the memory space of the test memory module to be tested completely in the address defect memory.

By virtue of this embodiment of the invention, a very fast and complete checking of test memory modules is possible in a very simple manner. By virtue of this embodiment of the invention, it is also possible to use address defect memories for the defect analysis of test memory modules which, with regard to the storage capacity, are made smaller than the respective memory space of the test memory module.

In accordance with a further embodiment of the invention, the steps of writing of test information items, read-out of memory information items, comparison of the test information items with the memory information items for each memory cell for correspondence, the combination of parts of the memory space and also the generation of a mapping of these combined parts of the memory space on an area of the address defect memory are repeated.

This repetition is performed when, during the combination of a plurality of parts of the memory space, two or more memory cells on these parts of the memory space have been ascertained as defective. Given the presence of two or more defective memory cells on memory space parts to be combined, the information items about the addresses of the defective memory cells in the memory space and also about the data lines to which the defective memory cells are connected cannot be determined unambiguously if only one address defect memory is formed.

Accordingly, during each repetition of the abovementioned steps, a new defect information item is stored in the address defect memory, the parts of the memory space being combined in such a way that the combined parts of the memory space differ from the previous combinations of the parts of the memory space. During each repetition of the abovementioned steps, a mapping in the address defect memory is generated from said combined parts, which mapping replaces the mapping generated in the respective last repetition.

After each generation of a new address defect memory, the addresses of the defective address defect memory cells and also the data lines of the memory space parts combined in the address defect memory are noted by the test program.

If, during the combination of a plurality of memory cells, two or more memory cells are defective, then the property information item of a defective memory cell, preferably a number "1", is entered into the corresponding address defect memory cell.

In this embodiment of the invention, the data line which is connected to the defective memory cell is determined from the numbers of the data lines that are contained in the data defect memory. The addresses of the defective memory cells in the memory space are determined from the noted addresses of the defective address defect memory cells and also from the data lines of the memory space parts combined in the address defect memory.

In this case, the addresses of the defective memory cells can be calculated from the different combinations of parts of the memory space by means of a number of determination equations. In this case, the maximum number of defects per memory space is limited to the total number of data lines. A determination equation can be established for each data line of the test memory module.

In this embodiment of the invention, it is advantageous that a test memory module having a multiplicity of defective memory cells can be checked very quickly and in a highly memory-optimal fashion. With a small number of read and write commands, a test memory module can be checked very speed-optimally and very reliably using the method according to the invention in the present embodiment.

The stepwise execution of different compressions or different combinations of parts of the memory space and the mapping thereof in the address defect memory enable a test of test memory modules with the aid of an address defect memory which, with regard to the storage capacity, greatly undershoots the memory space of the test memory module.

In accordance with a further embodiment of the invention, the steps of writing of test information items to the memory cells, read-out of the memory information from the memory cells, comparison of the test information items with the memory information items for each memory cell for correspondence, and also the combination of a plurality of parts of the memory space and the generation of a mapping of these combined parts of the memory space onto an area of the address defect memory are repeated. Upon the determination of n defective memory cells upon the first generation of the mapping of the parts of the memory space in the address defect memory, the abovementioned steps are repeated (n−1) times. This ensures that the addresses of the defective memory cells in the memory space and also the data lines which are connected to the defective memory cells can be determined unambiguously.

Ambiguities are avoided by means of the multiple execution of the abovementioned steps. This embodiment of the invention ensures a particularly effective determination of the addresses of the defective memory cells in the memory space and also of the data lines which are connected to the defective memory cells. Accordingly, it is ensured that the method for the defect analysis of memory modules is carried out particularly reliably and in a particularly speed-optimal fashion.

In this embodiment of the invention, x different parts of the memory space are combined and a mapping of these combined parts of the memory space on an area of the address defect memory is generated. In total, y data lines are arranged on the test memory module to be tested. The method according to the invention enables an unambiguous determination of the addresses of the defective memory cells in the memory space and also of the data lines which are connected to the defective memory cells precisely when defects occur on at most y=z−x−1 data lines. In the case where defective memory cells occur on the maximum number of data lines, those data lines which have no defective memory cells are in each case combined with a data line containing a defective memory cell and so, progressively in each case, all the defective memory cells are determined with respect to the data lines. This parallel combination is effected a total of z times.

The invention is also realized in a computer program for executing a method for the defect analysis of memory modules. In this case, the computer program is designed in such a way that, after the connection of a test memory module to the computer system, a method according to one of the preceding claims is realized. In this case, a number of defective memory cells with the associated address information items can be output as the result of the method.

The computer program improved according to the invention yields an improved coverage of the checking of memory cells, a simple and effective defect analysis of memory modules and a runtime improvement relative to the known methods for the defect analysis of memory modules.

The invention additionally relates to a computer program which is contained on a storage medium, which is stored in a computer memory, which is contained in a random access memory, or which is transmitted on an electrical carrier signal.

Furthermore, the invention relates to a data carrier with such a computer program and also to a method in which such a computer program is downloaded from an electrical data network, such as, for example, from the Internet, onto a computer connected to the data network.

The data lines which are connected to memory space parts containing defective memory cells can be determined by means of a "data fail memory" command. The addresses of the defective memory cells can be determined by means of an "address fail memory" command. The information items about defective memory cells that are obtained by means of the method according to the invention for the defect analysis of memory modules can be recorded by means of failure images and be analyzed further in existing evaluation programs. Extensive analysis data records about test memory modules which were measured under the same conditions are thereby obtained.

With a sequence of test patterns and with an evaluation of the address defect memory, it is possible, for example, to create a program for "retention" analysis which simultaneously determines "pass/fail" information items and also information items about the number of defective memory cells and the addresses of the defective memory cells.

The information items concerning addresses of memory cells comprise bank, row and column addresses and also the data line information items or DQ/data query information items. The data lines of a test memory module form the "bus" via which the data are transmitted. Via each data line of the bus, a specific area of the address defect memory is allocated via a fixed wiring. Consequently, a specific memory depth is also defined. This is the preset operating mode of the test program.

The memory depth is often dependent on clock rates with which the test memory module is operated. In a test system used by way of example, "Advantest T5581", the memory depth is 16 Mbit per data line at a clock rate of 16 ns or more. At clock rates of between 8 ns and 16 ns, the memory depth is reduced to 8 Mbit.

The invention is illustrated in more detail in the drawings using six exemplary embodiments.

DESCRIPTION OF THE PREFERRED EMBODIMENTS

Figure 1:
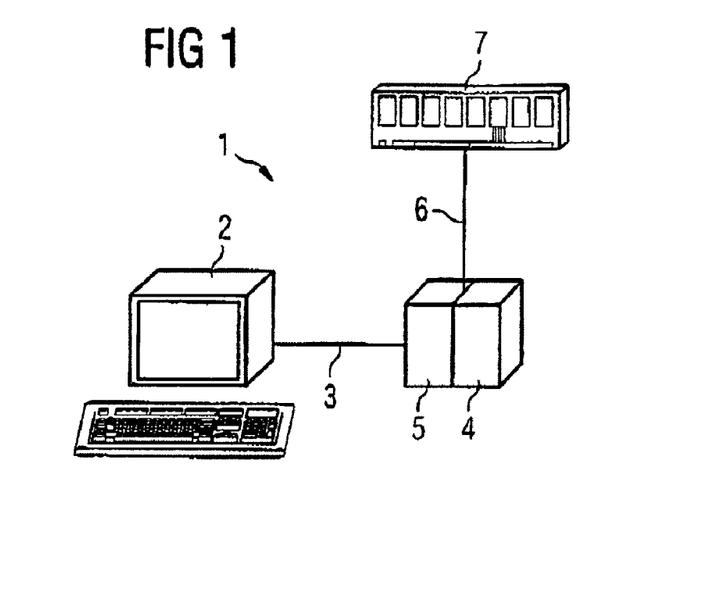
FIG. 1 is a schematic representation of a memory device defect analysis system.
Figure 2:
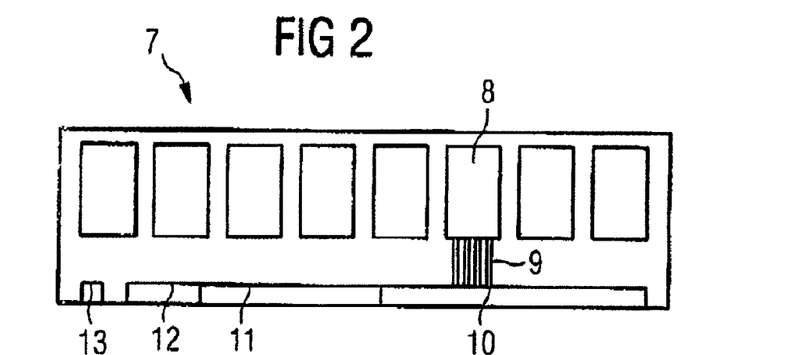
FIG. 2 is an enlarged plan view of the test memory module Shown in FIG. 1.
Figure 3:
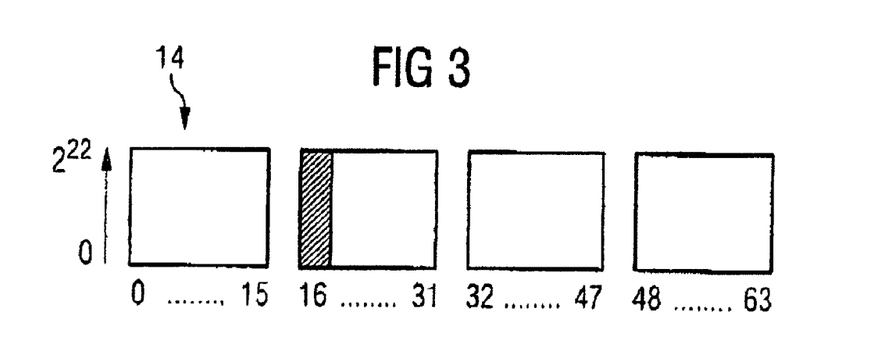
FIG. 3 is a schematic representation of a first exemplary embodiment of the address defect memory shown in FIG. 1.
Figure 4:
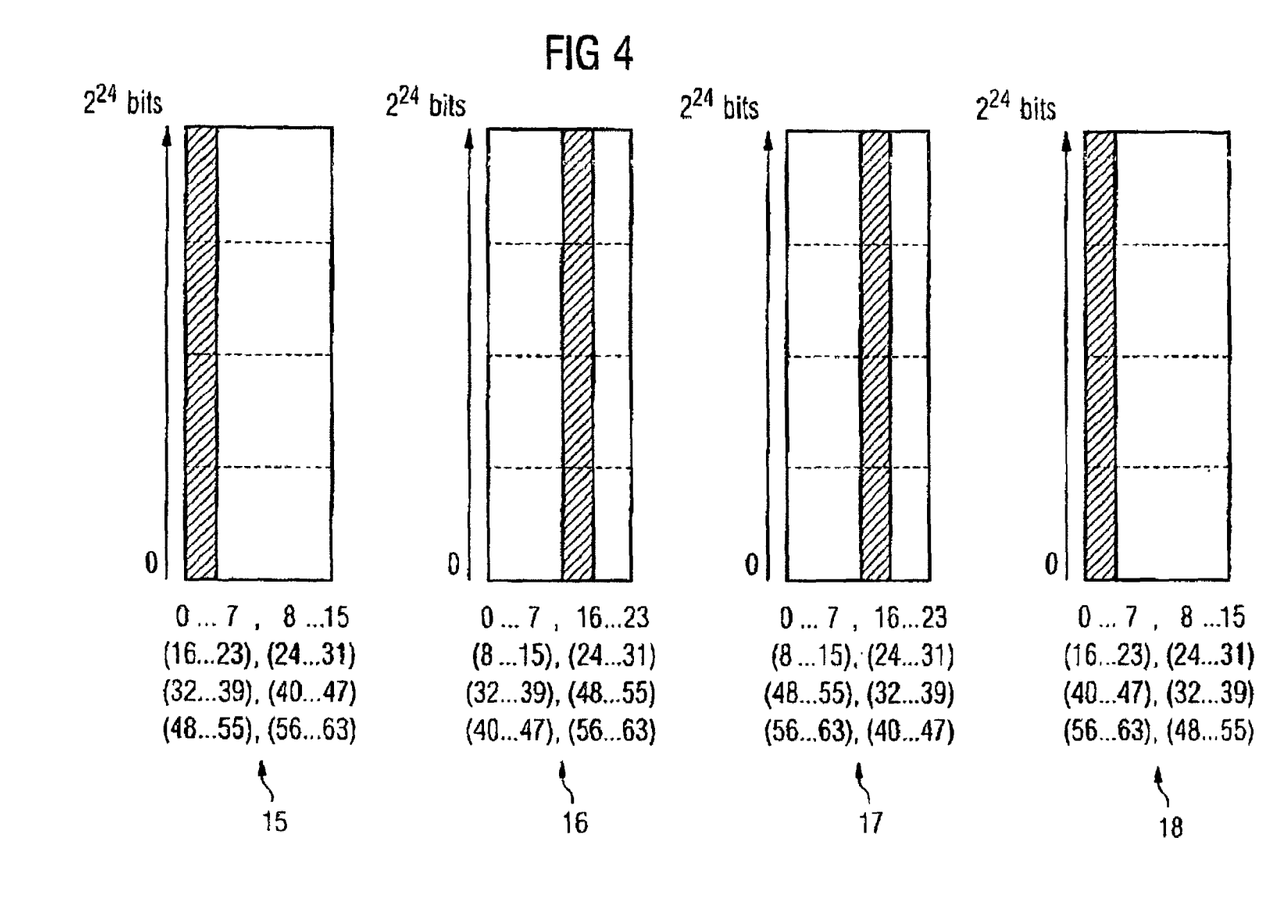
FIG. 4 is a schematic representation of a second exemplary embodiment of the address defect memory shown in FIG. 1.
Figure 5:
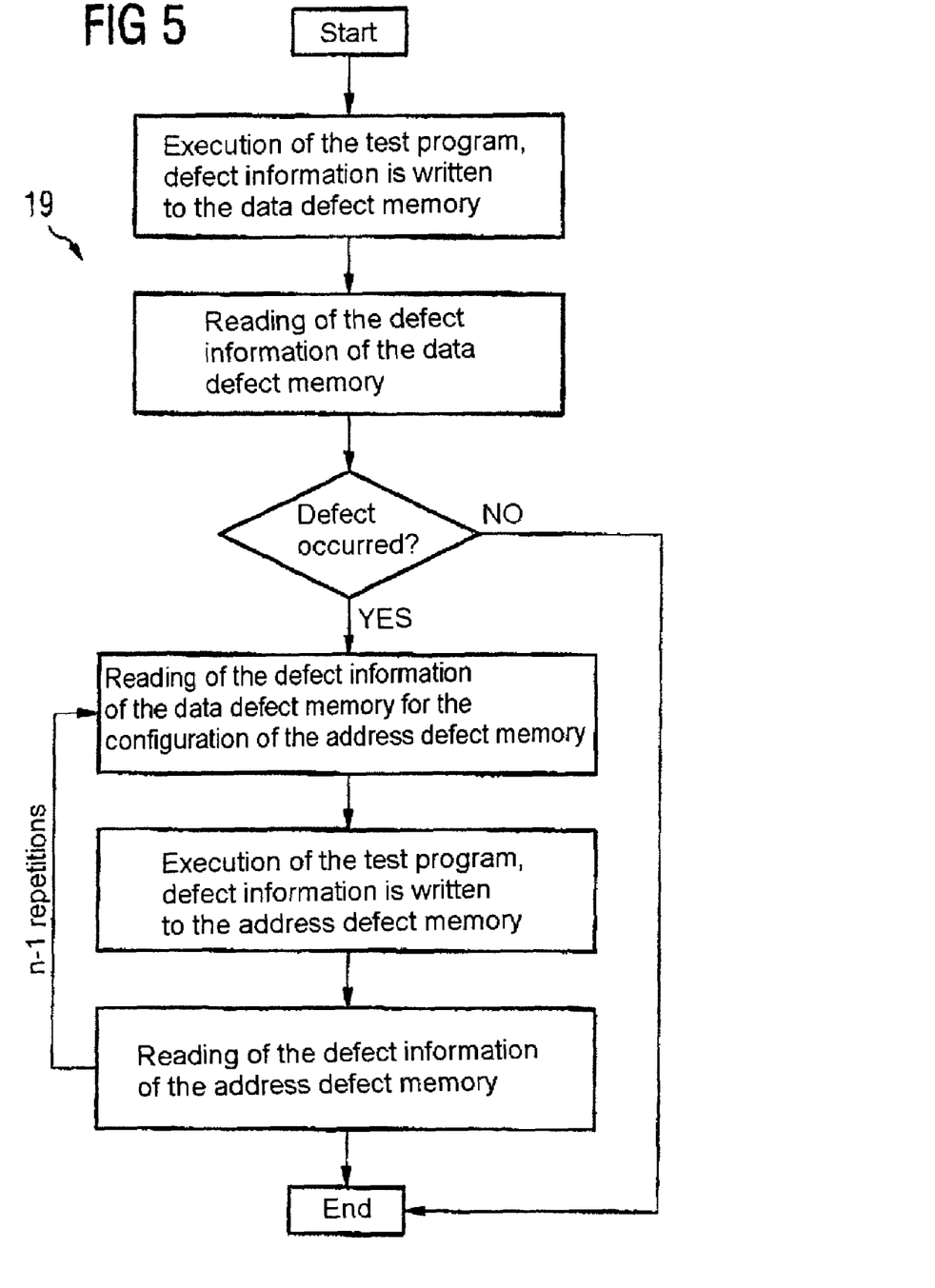
FIG. 5 is a flow diagram of a memory device defect analysis method.
Figure 6:
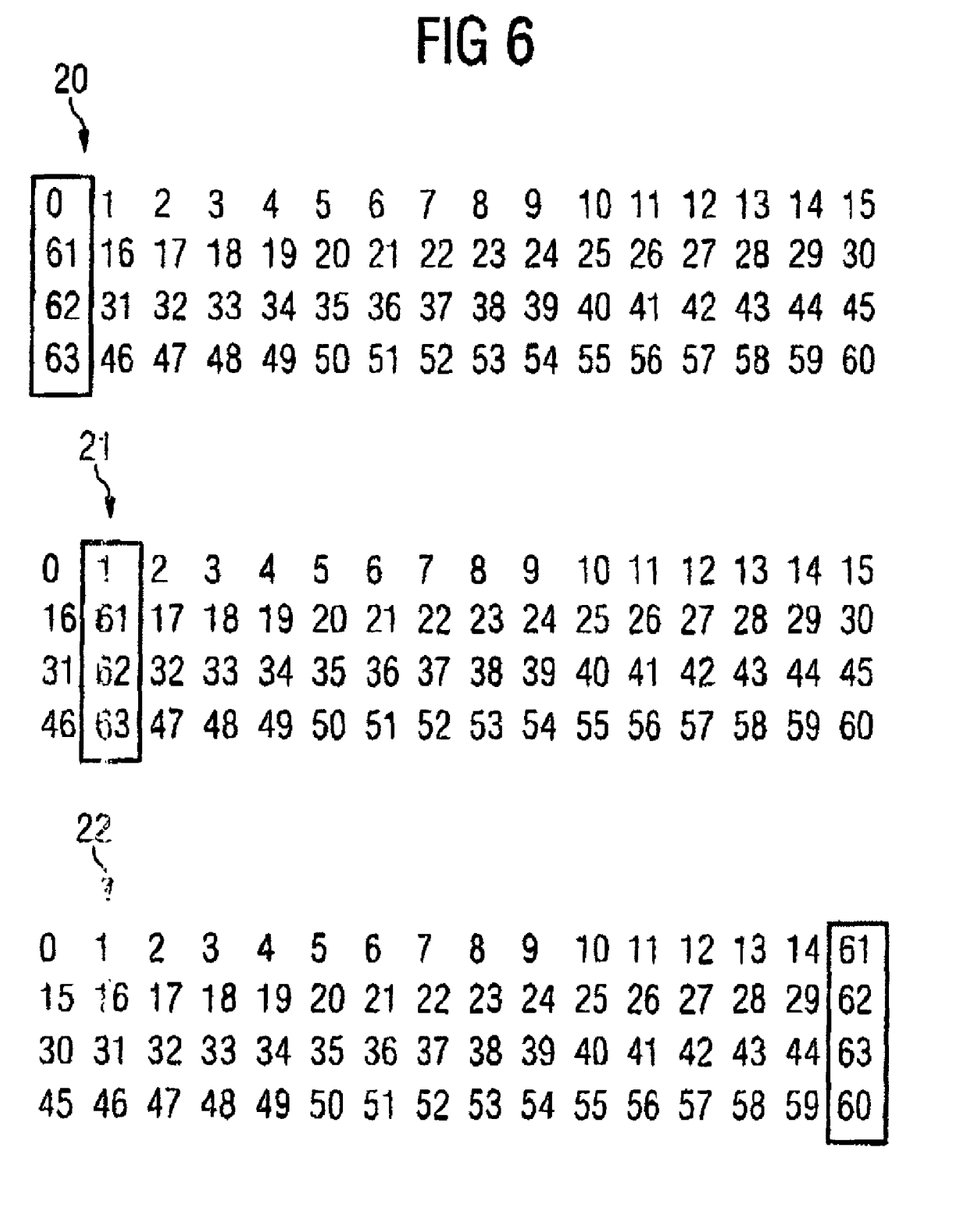
FIG. 6 is a schematic representation of an exemplary embodiment of a first data line combination, a second data line combination, and a third data line combination.

FIG. 1 shows a schematic representation of a memory device defect analysis system 1 with a computer system 2, with a first data link 3, with a data defect memory 4, with an address defect memory 5, with a second data link 6 and with a test memory module 7, FIG. 2 shows an enlarged plan view of the test memory module 7 from FIG. 1, which is structured into a first memory device 8, into a first data line 9, into a first data line contact 10, into a first address line contact 11, into a command line contact 12 and into a voltage supply contact 13, FIG. 3 shows a schematic representation of a first address defect memory division 14 of the address defect memory 5 as shown in FIG. 1, in accordance with a first exemplary embodiment, FIG. 4 shows schematic representations of a second address defect memory division 15, a third address defect memory division 16, a fourth address defect memory division 17 and also a fifth address defect memory division 18 of the address defect memory 5 shown in FIG. 1, in accordance with a second exemplary embodiment, FIG. 5 shows a flow diagram of a memory device defect analysis method 19, which has a start field, five execution fields, a decision field and also an end field, in accordance with a third exemplary embodiment, in accordance with a fourth exemplary embodiment and in accordance with a fifth exemplary embodiment, FIG. 6 shows a first data line combination 20, a second data line combination 21, and a third data line combination 22 in accordance with a sixth exemplary embodiment.

FIG. 1 shows a memory device defect analysis system 1 with a computer system 2, with a first data link 3, with a data defect memory 4, with an address defect memory 5, with a second data link 6 and with a test memory module 7.

The computer system 2 has a computing unit (not shown here) with at least one processor, a memory unit (not shown here) with at least one random access memory or main memory RAM and with at least one hard disk store and an output medium, such as a screen. The computer system 2 is connected to the data defect memory 4 and also to the address defect memory 5 by the first data link 3. The data defect memory 4 and the address defect memory 5 may either be provided in the computer system 2 or be connected externally to the computer system 2, as is illustrated in FIG. 1.

The test memory module 7 is connected to the computer system 2, or to the data defect memory 4 and to the address defect memory 5, via the second data link 6.

In order to carry out defect analyses in the test memory module 7, a test program is provided on the computer system 2. The data defect memory 4 and also the address defect memory 5 represent additional memory units of the computer system 2 with the aid of which information items about the addresses of defective memory cells of the test memory module 7 can be stored and which can be activated and read out by means of commands of the test program.

The memory device defect analysis system 1 makes it possible to analyze, and check for defective memory cells, a multiplicity of commercially available memory chips and memory modules which are used in personal computers, servers, routers and mobile radio applications.

The data defect memory 4 is formed as a list for receiving numbers of those data lines which are connected to defective memory cells.

The address defect memory 5 can be generated from the test memory module 7. It is formed as a mapping of the memory space or of an area of the memory space of the test memory module 7. Each address defect memory cell has a property information item about the functionality of a respective memory cell. Consequently, each information item contained in an address defect memory cell states whether a corresponding memory cell is defect-free or defective.

In the exemplary embodiments according to the invention, the storage capacity of the address defect memory 5 is 256 Mbit.

FIG. 2 shows an enlarged plan view of the test memory module 7 from FIG. 1, which is structured into a first memory device 8, into a first data line 9, into a first data line contact 10, into a first address line contact 11, into a command line contact 12 and into a voltage supply contact 13.

The test memory module 7 has a first memory device 8 and also seven further structurally identical memory devices which have a multiplicity of memory cells for storing information items. Each memory device has a storage capacity of 128 Mbit. Accordingly, the total storage capacity of the test memory module 7 is 1.024 Gbit. The first memory device 8 has the first data line 9 and also seven further data lines, which can be connected by means of the first data line contact 10 and also seven further data line contacts to the computer system 2, or to the data defect memory 4 and also to the address defect memory 5.

The seven further memory devices of the test memory module 7 likewise have in each case eight data lines and in each case eight data line contacts. Accordingly, the test memory module 7 comprises 64 data lines. The total storage capacity of 1.024 Gbit per 64 data lines corresponds to a storage capacity of 16 Mbit per data line or of $2^{24}$ bits per data line.

The memory cells of the memory devices of the test memory module 7 are addressed by a total of 14 address lines (not shown here) which are connected to all eight memory devices in parallel. The connection of the address lines to the computer system 2 or to the address defect memory 5 is effected via the first address line contact 11 and also via 13 further address line contacts, which are in each case connected to an address line. The address lines are multiplexed and used to span the entire address space. To that end, a total of 24 address bits are divided between 14 x addresses and 10 y addresses. Accordingly, the total address space turns out to have a size of $2^{14} \times 2^{10}$ bits=$2^{24}$ bits=16 Mbit.

Besides the address and data lines, the test memory module 7 additionally comprises the voltage supply contact 13 for supplying the test memory module 7 with voltage and also the first command line contact 12 and further command line contacts (not shown here), which are in each case connected to command lines and with the aid of which read and write commands can be transmitted.

FIG. 3 shows a schematic representation of a first address defect memory division 14 of the address defect memory 5 shown in FIG. 1, in accordance with a first exemplary embodiment.

In this case, the test memory module 7, having a storage capacity of 1.024 Gbit, is connected to the address defect memory 5, having a total capacity of 256 Mb.

The address defect memory 5 is formed from the test memory module 7. The address defect memory 5 has a multiplicity of address defect memory cells which are formed as mappings of memory cells of the test memory module 7.

Each address defect memory cell of the first address defect memory division 14 in FIG. 3 corresponds to precisely one memory cell of the test memory module 7. Each address defect memory cell of the first address defect memory division 14 in FIG. 3 contains a respective information item which states whether or not the respectively associated memory cell of the test memory module 7 has a defect.

The 64 data lines of the test memory module 7 to be tested are represented in the x direction of the first address defect memory division 14 in FIG. 3. In this case, the storage capacity of the address defect memory 5 is divided between the 64 data lines of the test memory module 7. In FIG. 3, the data lines "0–15" of the first two memory devices, the data lines "16–31" of the third and fourth memory devices, the data lines "32–47" of the fifth and sixth memory devices and also the data lines "48–63" of the seventh and eighth memory devices are in each case represented in a manner combined as blocks.

The memory devices represented as blocks are physically separate from one another. They can be connected to one another by a software application, in particular by the test program. The hatched area in the second block of FIG. 3 represents the data line 16.

The address space is plotted in the y direction in FIG. 3. The address space comprises all the addresses of the address defect memory cells. In the present exemplary embodiment, the address space of the address defect memory 5 is limited to $2^{22}$ bits per data line. The total storage capacity of the address defect memory 5 is 256 Mbit, which are divided between 64 data lines in the present exemplary embodiment. Accordingly, a storage capacity of 4 Mbit per data line or $2^{22}$ bits per data line results.

With this first address defect memory division 14, only one quarter of the storage capacity of 1.024 Mb per 24 data lines or of $2^{24}$ bits per data line of the test memory module 7 to be tested is mapped in the address defect memory 5. Consequently, a difference of $3\times2^{22}$ bits which is lost results per data line. Accordingly, with the first address defect division 14, not all the information items about the memory cells of the test memory module 7 can be mapped onto the address defect memory 5. The data loss amounts to 768 Mbit in total.

FIG. 4 shows a second address defect memory division 15, a third address defect memory division 16, a fourth address defect memory division 17 and also a fifth address defect memory division 18 of the address defect memory 5 shown in FIG. 1, in accordance with a second exemplary embodiment.

In the case of these address defect memory divisions, the information items about the functionality of the memory cells of the test memory module 7 are mapped onto the address defect memory 5 in such a way that a plurality of parts of the memory space are combined, and that one address defect memory cell corresponds to a plurality of memory cells.

In this case, four data lines of the test memory module 7 are always connected to the address defect memory 5 in parallel. The address defect memory 5 is in each case divided between 16 areas of the test memory module 7, which in each case combine four data lines. This results in a total storage capacity of the address defect memory 5 of 256 Mbit per 16 data lines and also a storage capacity of the address defect memory 5 of 16 Mbit per data line or of $2^{24}$ bits per data line. This storage capacity per data line of the address defect memory 5 corresponds to the storage capacity per data line of the test memory module 7. Consequently, no loss of data occurs in the data lines. The information items of the memory cells of the test memory module 7 can be mapped onto the address defect memory 5.

In the second address defect memory division 15, in the address defect memory division 16, in the fourth address defect memory division 17 and in the fifth address defect memory division 18 in accordance with FIG. 3, in each case the areas of the combined data lines are represented in the x direction and in each case the address space is represented in the y direction. The data lines—represented beneath one another—of the test memory module 7 are connected to the address defect memory 5 in parallel.

In the case of the second address defect memory division 15, the data lines are connected in groups (0–7, 8–15), (16–23, 24–31), (32–39, 40–47) and (48–55, 56–63). In the case of the third address defect memory division 16, the data lines are connected in groups of (0–7, 16–23), (8–15, 24–31), (32–39, 48–55) and (40–47, 56–63). In the case of the fourth address defect memory division 17, the data lines are connected in groups of (0–7, 16–23), (8–15, 24–31), (48–55, 32–39) and (56–63, 40–47). In the case of the fifth address defect memory division 18, the data lines are connected in groups of (0–7, 8–15), (16–23, 24–31), (40–47, 32–39) and (56–63, 48–55) in parallel.

The hatched area in each case represents the data line 16. In the case of the second address defect memory division 15, the data line 16 is connected in parallel with the data lines 0, 32 and 48. In the case of the third address defect memory division 16, the data line 16 is connected in parallel with the data lines 24, 48 and 56. In the case of the fourth address defect memory division 17, the data line 16 is connected in parallel with the data lines 24, 32 and 40. In the fifth address defect memory division 18, said data line 16 is connected in parallel with the data lines 0, 40 and 56.

The parallel connection of in each case four data lines of the test memory module 7 to the address defect memory 5 results in an ambiguity. Information items concerning four memory cells are in each case contained in an address defect memory cell.

The ambiguity is resolved by a data defect memory 4 additionally being evaluated. The defects per data line are stored in said data defect memory 4. Furthermore, the ambiguity through the parallel connection of a plurality of data lines is resolved by selection of further address defect memory divisions which differ with regard to the combined data lines.

The four address defect memory divisions in FIG. 4 are necessary in order to preclude all ambiguities even when four defects occur on four data lines connected in parallel. By way of example, if a defect occurs in each case on the data lines 0, 16, 32 and 48, then the ambiguities that occur cannot be resolved by the second address defect memory division 15. The ambiguities can be resolved by the choice of further address defect memory divisions, in particular by the third address defect memory division 16, by the fourth address defect memory division 17 and also by the fifth address defect memory division 18.

FIG. 5 shows a memory device defect analysis method 19, represented in the form of a flow diagram with a start field, with five execution fields, with a decision field and also with an end field, in accordance with a third exemplary embodiment, in accordance with a fourth exemplary embodiment and in accordance with a fifth exemplary embodiment.

The memory device defect analysis method 19 illustrates the testing according to the invention of a test memory module 7 which is connected to the computer system 2 or to the data defect memory 4 and also to the address defect memory 5.

At the beginning of the memory device defect analysis method 19, the test program is executed on the computer system 2. In this case, data are written to all the memory cells of the test memory module 7 and are then read out again. Memory cells in which the written information items deviate from those read out are defective. Data lines via which such defective memory cells are transmitted are written to the data defect memory 4. Afterward, the information items are read from the data defect memory 4.

In the case where no defect has occurred, the data defect memory 4 is empty. In this case, the memory device defect analysis method 19 for the test memory module 7 to be tested is ended. No defective memory cells have been identified in the test memory module 7.

In the case where one or more defects have occurred, the data defect memory 4 contains information items about data lines which have defective memory cells. n ambiguities per compressed data line result for each defect that has occurred or for each defective memory cell. In the second exemplary embodiment in accordance with FIG. 4, a maximum of four ambiguities accordingly result for each area of combined data lines.

In the case of the presence of defective memory cells, the data defect memory 4 is read in order to configure the address defect memory 5 in such a way that the defect information items can be read out ambiguously. In this case, address defect memory divisions are chosen in which data lines of the test memory module are connected to the address defect memory 5 in parallel, as is shown in FIG. 4.

Afterward, the test program is executed anew, information items about defect-free and about defective memory cells being written to the address defect memory 5. The defect information items are then read from the address defect memory 5.

The steps of configuring the address defect memory 5, executing the test program with the writing of the defect information items to the address defect memory 5 and also reading the defect information items from the address defect memory 5 are repeated (n−1) times. Accordingly, three repetitions are executed in the second exemplary embodiment in accordance with FIG. 4.

The memory device defect analysis method 19 is then ended. The defective memory cells and also their addresses within the test memory module 7 are determined unambiguously.

Three exemplary embodiments for the defect analysis of the test memory module 7 are explained below.

In all three exemplary embodiments, an explanation will be given of both the method elucidated in FIG. 3 using the first address defect memory division 14, which method is called the assignment method below, and the method described in FIG. 4, using the second address defect memory division 15, the third address defect memory division 16, the fourth address defect memory division 17 and the fifth address defect memory division 18, which method is called the connection method below.

The third exemplary embodiment considers the test memory module 7 which has a defect on the data line 16, the address of the defective memory cell lying in the address space $0<f<2^{22}$ bits. The data defect memory 4 yields a defect on the data line 16.

In the assignment method, the address defect memory 5 yields a defect on the data line 16 and the address of the defective memory cell in the address space $0<f<2^{22}$ bits. Accordingly, both the information about the data line and the information about the address of the defective memory cell are present. Consequently, the defective memory cell in the test memory module 7 is determined unambiguously.

In the connection method, the address defect memory 5, in accordance with the second address defect memory division 15, yields a failure on the data line 0 or 16 or 32 or 48 and also the address of the defective memory cell in the address space $0<f<2^{22}$ bits. The information about the affected data line is given by the data defect memory 4. The information about the address of the defective memory cell is prescribed by the address defect memory 5. Consequently, the defective memory cell of the test memory module 7 is determined unambiguously. The ambiguity of the information about the data line, which arises through the evaluation of the address defect memory 5 according to the connection method, is eliminated by the evaluation of the data defect memory 4.

A fourth exemplary embodiment considers the test memory module 7 which has a defect on the data line 16, the address of the defective memory cell being arranged in the address space $2^{22}$ bits$<f<2^{24}$ bits. The data defect memory 4 yields a defect on the data line 16.

In the assignment method, the address defect memory yields a failure on the data line 16. The address defect memory 5 yields no address of a memory cell in the address space $0<f<2^{22}$ bits. Accordingly, the address of the defective memory cell cannot be ascertained by the assignment method. The defect analysis of the test memory module 7 does not give a satisfactory result in this exemplary embodiment.

According to the connection method, the second address defect memory division 15 yields a defect on the data line 0 or 16 or 32 or 48 and also the address of the defective memory cell in the address space $2^{22}$ bits$<f<2^{24}$ bits. Consequently, the information about the data line on which the defective memory cell is transmitted can be determined from the data defect memory 4 and the information about the address of the defective memory cell can be determined from the address defect memory 5. The defective memory cell of the test memory module 7 is accordingly determined unambiguously.

In the fifth exemplary embodiment, the test memory module 7 examined has a defect in each case on the data lines 0, 16, 32 and 48. The addresses of the defective memory cells a, b, c and d all lie in the address space $2^{22}$ bits$<a, b, c, d<2^{24}$ bits. The data defect memory 4 yields a defect in each case on the data lines 0, 16, 32 and 48.

In the assignment method, the address defect memory 5 yields a defect in each case on the data lines 0, 16, 32 and 48. The address defect memory 5 yields no addresses of defective memory cells in the address space $0<f<2^{22}$ bits. Consequently, the defective memory cells cannot be determined by means of the assignment method, since there are no items of information present about the addresses of the defective memory cells in the address space $2^{22}$ bits$<a, b, c, d<2^{24}$ bits. Accordingly, a satisfactory result cannot be obtained in this case with the assignment method.

In the connection method, the address defect memory 5, in the second address defect memory division 15, yields four defects on the data line 0 or 16 or 32 or 48 and also four addresses of defective memory cells a, b, c and d in the address space $2^{22}$ bits$<a, b, c, d<2^{24}$ bits. The information items about the data lines and also the information items about the addresses of the defective memory cells are ambiguous. Accordingly, the defective memory cells are not defined unambiguously.

In accordance with the memory device defect analysis method 19 in FIG. 5, when ambiguities occur, the steps "reading of the defect information of the data defect memory for the configuration of the address defect memory", "execution of the test program, defect information is written to address defect memory" and "reading of the defect information of the address defect memory" are repeated. The number of repetitions corresponds to the number of ambiguities reduced by 1.

In the present fifth exemplary embodiment, four ambiguities result from the execution of the test program with the second address defect memory division 15. Accordingly, the abovementioned steps are repeated three times, in the first repetition the address defect memory 5 being divided in accordance with the third address defect memory division 16, in the second repetition the address defect memory 5 being divided in accordance with the fourth address defect memory division 17, and in the third repetition the address defect memory 5 being divided in accordance with the fifth address defect memory division 18.

From this multiple creation of the address defect memory 5 with different address defect memory divisions, the data lines and also the addresses of the defective memory cells are determined unambiguously. Accordingly, an unambiguous result of the checking of the test memory module 7 can be obtained with the assignment method of address defect memory division.

By means of the connection method, the addresses and also the data lines of the defective memory cells can be determined unambiguously in the present fifth exemplary embodiment. The fifth exemplary embodiment is ended at this point.

An unambiguous assignment is possible in the general case with 64 defects on 64 data lines. In accordance with the method described above, 64 iterations of the steps "reading of the defect information of the data defect memory for the configuration of the address defect memory", "execution of the test program, defect information is written to address defect memory" and "reading of the defect information of the address defect memory" are effected one after the other. During each step, the address defect memory 5 is provided with a new address defect memory division. Accordingly, after carrying out these repetitions, 64 determination equations are available for the 64 unknown addresses of the defective memory cells and also for the 64 non-unambiguous data lines.

FIG. 6 shows a first data line combination 20, a second data line combination 21 and a third data line combination 22 in accordance with a sixth exemplary embodiment.

In this sixth exemplary embodiment, defective memory cells are present on precisely 61 data lines. A defective memory cell is present in each case on the data lines 0–60, and the data lines 61, 62 and 63 are defect-free. In order to achieve an unambiguous assignment of data lines and of addresses of defective memory cells by means of the connection method, the three defect-free data lines are in each case connected in parallel with a data line which has a defective memory cell. Thus, all the defective cells on the data lines which have defective memory cells are progressively determined. This procedure is successively executed 61 times.

In the first data line combination 20, the defect-free data lines 61, 62 and 63 are combined with the defect-exhibiting data line 0. The address of the defective memory cell on the data line 0 is subsequently determined. Afterward, the second data line combination 21 is created, the defect-exhibiting data line 1 being combined with the defect-free data lines 61, 62 and 63. The address of the defective memory cell on the data line 1 is subsequently determined. This method is continued for the next data lines 2, 3, ... 58, 59. Finally, the defect-exhibiting data line 60 is combined with the defect-free data lines 61, 62 and 63. All defect-exhibiting data lines and all the addresses of the defective memory cells on these data lines are then known.

This method makes it possible always to perform an unambiguous assignment of data lines and also addresses of defective memory cells in the address defect memory 5. This is possible only when defects occur on at most 64−3=61 data lines.

We claim:

1. A method of using a computer system to perform a defect analysis of memory modules, the method which comprises:

a) providing the computer system with at least one data defect memory, at: least one address defect memory, and a test program;

b) providing a memory module including a memory space with a plurality of memory cells for storing information items, a plurality of physical data lines, the data lines being numbered by consecutive numbers, the data lines being connected to the memory cells for transferring information items written to and read from the memory cells, and a plurality of address lines for addressing the plurality of the memory cells;

c) dividing the memory cells into a plurality of parts of the memory space, each memory cell of one part of the memory space being uniquely determined by an address, one address determining one memory cell in each of one of the plurality of the parts of the memory space;

d) connecting all memory cells of one part of the memory space to one data line;

e) forming the data defect memory as a list for storing the numbers of data lines that are connected to defective ones of the plurality of the memory cells;

f) forming the address defect memory as a mapping of the memory space or of an area of the memory space and initially emptying the address defect memory, wherein the address defect memory having a storage capacity being less than the memory module;

g) connecting the computer system to the memory module;

h) writing information items to the plurality of the memory cells and subsequently reading-out information items contained in the plurality of the memory cells;

i) comparing the written information items with the read information items to determine if there are deviations;

j) continuing with steps k) to o) if at least one deviation was detected, otherwise ending the method;

k) storing, into the data defect memory, numbers of ones of the plurality of the data lines that are connected to ones of the plurality of the memory cells in which the deviations were determined in step j);

l) repeatedly writing information items to the plurality of the memory cells and subsequently reading-out information items contained in the plurality of the memory cells;

m) comparing the written information items used in step l) with the information items obtained in step l) to determine if there are deviations;

n) storing, in the address defect memory, a property information item as to whether the memory cell is defect-free or defective for each of the memory dells checked in step in); and o) determining addresses of defective memory cells in the memory space from the address defect memory and determining ones of the plurality of the data lines that are connected to defective ones of the plurality of the memory cells from information items in the data defect memory.

2. The method according to claim 1, which comprises:

generating a first combination of the parts of the memory space, the first combination containing at least a first part of the memory space and a second part of the memory space;

in step n), storing a property information item indicating a defect-free state in the address defect memory if all corresponding memory cells in the first combination are defect-free;

in step n), storing a property information item indicating a defective state in the address defect memory if at least one of the corresponding memory cells in at least one of the parts of the memory space of the first combination is defective.

3. The method according to claim 2, which comprises:
while generating the first combination of parts of the memory space, and when there are two or more defective memory cells in the combination of the parts of the memory space, repeating steps l) to n);

during each repetition of steps l) to n), establishing a new combination of parts of the memory space in step n) such that the new combination differ from combinations generated in previous repetitions of steps l) to n);

in step n), storing a property information item indicating a defect-free state in the address defect memory if all corresponding memory cells in the new combination are defect-free;

in step n), storing a property information item indicating a defective state in the address defect memory if at least one of the corresponding memory cells in at least one of the parts of the memory space of the new combination is defective; and instead of step o), executing a following step o'):

o') using the data defect memory to determine which data lines are connected to defective ones of the plurality of the memory cells, and determining addresses of defective ones of plurality of the memory cells from the address defect memory cells and from the combinations of the parts of the memory space.

4. A computer-readable medium for storing computer-executable instructions for performing a method comprising the following steps:

a) providing the computer system with at least one data defect memory, at least one address defect memory, and a test program;

b) providing a memory module including a memory space with a plurality of memory cells for storing information items, a plurality of physical data lines, the data lines being numbered by consecutive numbers, the data lines being connected to the memory cells for transferring information items written to and read from the memory cells, and a plurality of address lines for addressing the plurality of the memory cells;

c) dividing the memory cells into a plurality of parts of the memory space, each memory cell of one part of the memory space being uniquely determined by an address, one address determining one memory cell in each of one of the plurality of the parts of the memory space;

d) connecting all memory cells of one part of the memory space to one data line;

e) forming the data defect memory as a list for storing the numbers of data lines that are connected to defective ones of the plurality of the memory cells;

f) forming the address defect memory as a mapping of the memory space or of an area of the memory space and initially emptying the address defect memory, wherein the address defect memory having a storage capacity being less than the memory module;

g) connecting the computer system to the memory module;

h) writing information items to the plurality of the memory cells and subsequently reading-out information items contained in the plurality of the memory cells;

i) comparing the written information items with the read information items to determine if there are deviations;

j) continuing with steps k) to o) if at least one deviation was detected, otherwise ending the method;

k) storing, into the data defect memory, numbers of ones of the plurality of the data lines that are connected to ones of the plurality of the memory cells in which the deviations were determined in step j);

l) repeatedly writing information items to the plurality of the memory cells and subsequently reading-out information items contained in the plurality of the memory cells;

m) comparing the written information items used in step l) with the information items obtained in step l) to determine if there are deviations;

n) storing, in the address defect memory, a property information item as to whether the memory cell is defect-free or defective for each of the memory cells checked in step m); and o) determining addresses of defective memory cells in the memory space from the address defect memory and determining ones of the plurality of the data lines that are connected to defective ones of the plurality of the memory cells from information items in the data defect memory.

5. The computer-readable medium according to claim 4, wherein the computer-readable medium is a storage medium.

6. The computer-readable medium according to claim 4, wherein the computer-readable medium is a computer memory.

7. The computer-readable medium according to claim 4, wherein the computer-readable medium is a random access memory.

8. The computer-readable medium according to claim 4, wherein the computer-executable instructions are transmitted on an electrical carrier signal.

9. The computer-readable medium according to claim 4, wherein the computer-readable medium is a data medium.

10. A method for obtaining computer readable instructions, which comprises:

connecting a computer onto an electronic data network; and from the data network onto the computer, downloading computer-executable instructions for performing the method comprising the following steps:

a) providing the computer system with at least one data defect memory, at least one address defect memory, and a test program;

b) providing a memory module including a memory space with a plurality of memory cells for storing information items, a plurality of physical data lines, the data lines being numbered by consecutive numbers, the data lines being connected to the memory cells for transferring information items written to and read from the memory cells, and a plurality of address lines for addressing the plurality of the memory cells;

c) dividing the memory cells into a plurality of parts of the memory space, each memory cell of one part of the memory space being uniquely determined by an address, one address determining one memory cell in each of one of the plurality of the parts of the memory space;

d) connecting all memory cells of one part of the memory space to one data line;

e) forming the data defect memory as a list for storing the numbers of data lines that are connected to defective ones of the plurality of the memory cells;

f) forming the address defect memory as a mapping of the memory space or of an area of the memory space and initially emptying the address defect memory, wherein the address defect memory having a storage capacity being less than the memory module;

g) connecting the computer system to the memory module;

h) writing information items to the plurality of the memory cells and subsequently reading-out information items contained in the plurality of the memory cells;

i) comparing the written information items with the read information items to determine if there are deviations;

j) continuing with steps k) to o) if at least one deviation was detected, otherwise ending the method;

k) storing, into the data defect memory, numbers of ones of the plurality of the data lines that are connected to ones of the plurality of the memory cells in which the deviations were determined in step j);

l) repeatedly writing information items to the plurality of the memory cells and subsequently reading-out information items contained in the plurality of the memory cells;

m) comparing the written information items used in step l) with the information items obtained in step l) to determine if there are deviations;

n) storing, in the address defect memory, a property information item as to whether the memory cell is defect-free or defective for each of the memory cells checked in step m); and o) determining addresses of defective memory cells in the memory space from the address defect memory and determining ones of the plurality of the data lines that are connected to defective ones of the plurality of the memory cells from information items in the data defect memory.

11. The method according to claim 10, wherein the electronic data network is an Internet.

* * * * *